(12) United States Patent
Koegel et al.

(10) Patent No.: US 6,549,386 B1
(45) Date of Patent: Apr. 15, 2003

(54) PROTECTION CIRCUIT FOR A SWITCH, AND A SWITCHED-MODE POWER SUPPLY

(75) Inventors: Reinhard Koegel, Brigachtal (DE); Eugen Kizmann, Villingen-Schwenningen (DE); Jean-Paul Louvel, Villingen-Schwenningen (DE)

(73) Assignee: Thomson Licensing SA, Boulogne Cedex (FR)

( * ) Notice: Subject to any disclaimer, the term of this patent is extended or adjusted under 35 U.S.C. 154(b) by 0 days.

(21) Appl. No.: 09/550,131

(22) Filed: Apr. 17, 2000

(30) Foreign Application Priority Data

May 6, 1999 (DE) .......................................... 199 20 625

(51) Int. Cl.$^7$ ................................................ H02H 3/00
(52) U.S. Cl. ......................... 361/93.1; 361/18; 361/90; 361/100
(58) Field of Search .......................... 361/18, 93.1, 100, 361/115, 90

(56) References Cited

U.S. PATENT DOCUMENTS 5,761,057 A * 6/1998 Muchenberger .............. 393/21

FOREIGN PATENT DOCUMENTS

| DE | 3515133 | 11/1986 |
|---|---|---|
| DE | 3531001 | 3/1987 |
| DE | 19529333 | 2/1996 |
| DE | 19735208 | 2/1999 |

OTHER PUBLICATIONS

Japanese Patent Abstract, JP 60–128867, E–358, Nov. 15, 1985, vol. 9, No. 288.
Search Report for German Patent Appln. No. 199 20 625.2, Aug. 17, 2000.

* cited by examiner

*Primary Examiner*—Stephen W. Jackson
(74) *Attorney, Agent, or Firm*—Joseph S. Tripoli; Havey D. Fried; Joseph J. Kolodka

(57) ABSTRACT

The protection circuit for a switch has an energy-storage means, which is connected to a control input of the switch and which is charged with a delay via resistance means when a control voltage is present and is discharged via switching means when the control voltage is low or absent, and has a switching stage which is connected to a supply voltage, is switched on when a specific threshold voltage is present across the energy-storage means and in this way reduces the supply voltage. In one exemplary embodiment, when the switching stage is switched on, the charge which is dissipated from the supply voltage is at least partially routed to the energy-storage means via a diode which is connected in parallel with the said energy-storage means, so that the phase during which the switching stage is switched on is lengthened and the energy-storage means, in this case a capacitor, is completely discharged.

12 Claims, 1 Drawing Sheet

PROTECTION CIRCUIT FOR A SWITCH, AND A SWITCHED-MODE POWER SUPPLY

BACKGROUND

The present invention relates to a protection circuit for switches, in particular such as those which are used in switched-mode power supplies, and to a switched-mode power supply relating to this.

Switches with a high-impedance control input, such as MOSFETs for example, are increasingly being used in switched-mode power supplies. The high impedance of the control input means that the switched-mode power supply can enter an undefined state in the event of a defect, which state can destroy the switch. This is possible, for example, in the event of a short circuit at the output of the switched-mode power supply or in the event of an interruption in the switched-mode power supply control loop, resulting in an interruption in the closed-loop-controlled switch operation. However, in cases such as this, a residual voltage may still be present at the control input of the switch, in the case of switched-mode power supplies, due, in particular, to their starting circuit, so that the switch is partially actuated. If the switch is only partially actuated, a high current flows through it when a voltage is still at the same time applied to it, so that its power loss becomes excessive and, in consequence, it is destroyed.

DE 197 35 208 A1 discloses a free-running switched-mode power supply having a protection circuit which reliably switches the switching transistor off when a short circuit occurs. In one exemplary embodiment, the control voltage at the input of the switching transistor is dissipated through a transistor stage, so that the switching transistor reliably remains switched off in the event of a short circuit.

The object of the present invention is to specify a protection circuit and a switched-mode power supply relating to this for a switch, which protection circuit prevents the switch from being actuated, and thus prevents it from being destroyed, in the event of a fault.

BRIEF SUMMARY OF THE INVENTION

The protection circuit of the present invention contains an energy-storage means which is connected to the control input of the switch and is charged with a delay via resistance means when a control voltage is present, and is then discharged via switching means when the control voltage is absent or low. Since switches of this type are normally actuated by square-wave voltages which are, for example, pulse-width modulated or whose frequency is variable for control of a switched-mode power supply, the energy-storage means is in this way charged slowly during the on-signal for the switch, but is discharged once again in the same way during the "off" signal. It is thus impossible for a higher voltage to build up across the energy-storage means during normal switch operation.

The protection circuit also contains a switching stage which is connected to a supply voltage for the switch, switches on when there is a specific threshold voltage across the energy-storage means, and in consequence reduces the supply voltage. The energy-storage means is, for example, a capacitor, and the switching stage is a single transistor stage or a pair of transistors connected in the form of a thyristor circuit.

When the switching stage is switched on at the said threshold voltage, the energy-storage means is at the same time discharged via the switching stage. A portion of the charge dissipated from the supply voltage is in this case at least partially routed to the energy-storage means, so that the phase during which the switching stage is switched on is lengthened. This is achieved by means of a diode in parallel with the energy-storage means. This diode at the same time prevents inverse charging of the energy-storage means.

The protection circuit can be used, in particular, for switched-mode power supplies such as those used in television sets or video recorders, for example. Switched-mode power supplies of this type normally have a supply voltage which is fed from a secondary winding of the transformer, and a starting circuit which supplies a supply voltage once the switched-mode power supply is switched on, until the switched-mode power supply supplies itself via the supply stage.

A control voltage is applied to the control input of the switch, by means of which the switched-mode power supply stabilizes output voltages via a control circuit arranged either on the secondary side or the primary side. The control input is decoupled from the starting circuit and from the supply stage via a resistance means. The energy-storage means in the protection circuit is in this case connected to the control input of the switching transistor, and the switching stage is connected to the starting circuit and to the supply stage.

In the event of a fault, a situation may arise in which the closed-loop-controlled switch operation is interrupted and a voltage builds up, for example due to the starting circuit, at the control input of the switch, and this voltage could at least partially switch the switch on. This is identified by the protection circuit, and the supply voltage and the voltage at the control input of the switch are reduced appropriately by the protection circuit, so that there is no risk to the switch.

A low-impedance current-measurement resistor is often connected downstream from the output of the switch in a switched-mode power supply, to supply current information for the control circuit. The output of the protection circuit is then advantageously connected to the higher-potential output of the switching transistor, rather than to earth.

BRIEF DESCRIPTION OF THE DRAWING

The invention will be explained in more detail in the following text using, by way of example, a schematic circuit diagram, in which:

The FIGURE shows a switched-mode power supply having a protection circuit.

DESCRIPTION OF PREFERRED EMBODIMENTS

Figure 1:
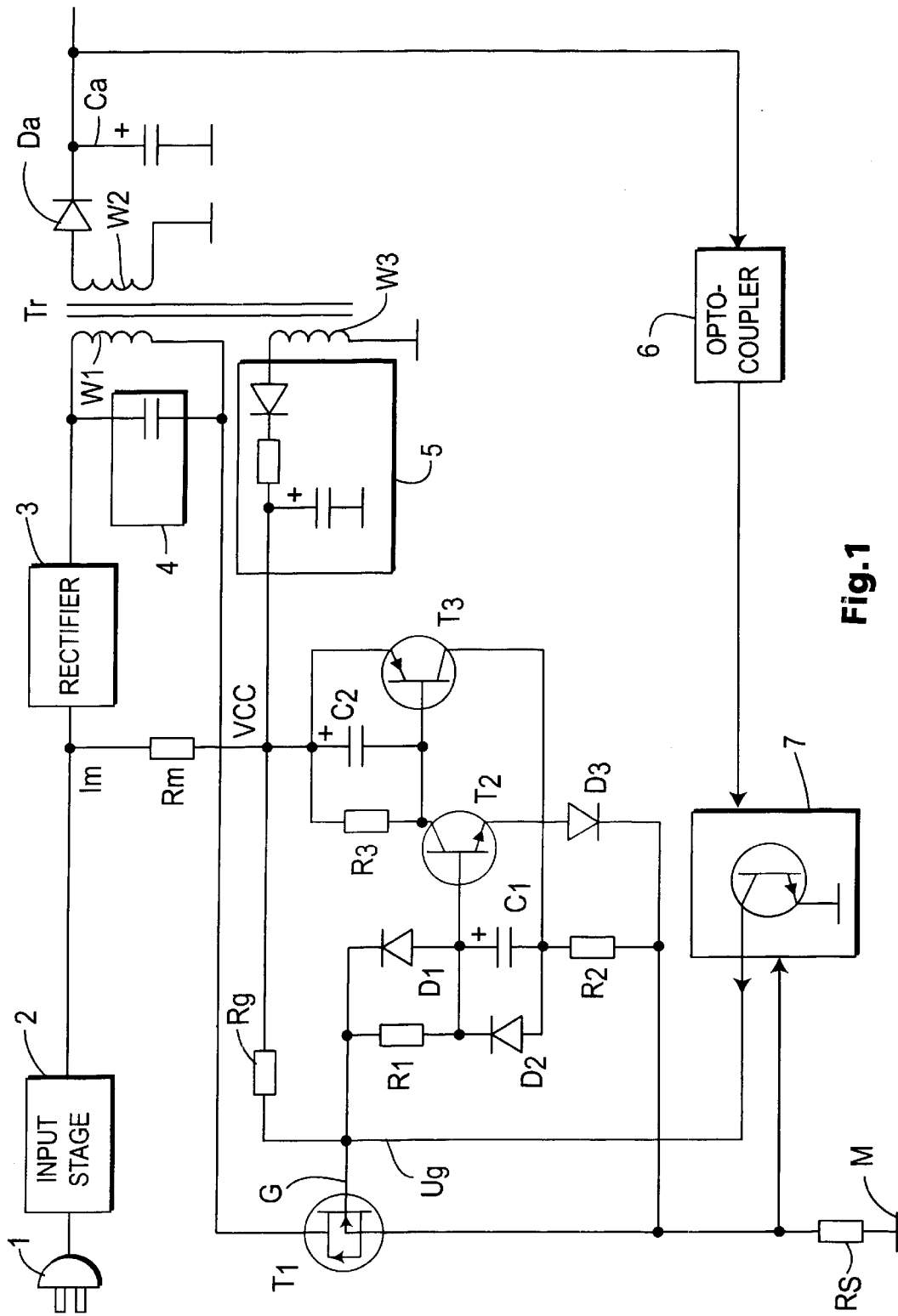

The switched-mode power supply in the FIGURE is connected via a mains connection 1 to the electrical mains system, whose mains voltage is present in an input stage 2, which, in particular, contains filters for filtering undesirable high-frequency voltages. The mains voltage is then rectified in a circuit 3, and is buffered via an energy-storage capacitor for operation of the switched-mode power supply.

This voltage is applied via the primary winding W1 of a transformer Tr to a switch T1, in this exemplary embodiment a MOSFET. The switch T1 is switched on and off cyclically during operation by means of a square-wave control voltage Ug, in order to transmit power to secondary windings W2 and W3 of the transformer Tr. The winding W3 is in this case arranged on the primary side and is used, via a supply circuit 5, to provide a supply voltage VCC for operation of the switched-mode power supply.

The voltage emitted from the winding W2 arranged on the secondary side is rectified via a diode Da and is stabilized by a capacitor Ca in order to supply an external load. The output voltage is stabilized by tapping it off and transmitting it to a control circuit 7 on the primary side via an optocoupler 6 (or else via other transmission means, since the switched-mode power supply provides mains isolation in this exemplary embodiment). This control circuit 7 controls the control input G of the switching transistor T1. The control circuit 7 is indicated only schematically and may, in particular, also be arranged on the secondary side. It may contain, for example, an integrated circuit with an oscillator, or else may be operated at a synchronized frequency. Furthermore, the switched-mode power supply may be in the form of a free-running switched-mode power supply.

The switched-mode power supply also contains a current-measurement resistor Rs, via which the output of the switching transistor T1 is connected to earth M and which provides current information for the control circuit 7, relating to the magnitude of the current flowing through the switching transistor T1.

The switched-mode power supply furthermore contains a starting circuit having a resistor or a resistor chain Rm, which provides a starting current Im in order to start the switched-mode power supply, until the switched-mode power supply supplies itself via the supply stage 5. This starting circuit may be connected either upstream or downstream of the energy-storage capacitor and the rectifier in the circuit 3. Furthermore, the switched-mode power supply contains a so-called snubber network 4 in parallel with the primary winding W1, which damps switching spikes when the switching transistor T1 switches off.

The protection circuit is connected to the control input G of the switching transistor T1, whose control voltage Ug is monitored. During the "on" phase of the switching transistor T1, a capacitor C1 in the protection circuit is charged slowly via a resistor R1. During the "off" phase of the switching transistor, the capacitor C1 is discharged quickly again via a diode D1, so that it is impossible for any increased voltage to build up across the capacitor C1 during normal operation. In this case, the diode D1 operates as a switching means and, for example, a controlled transistor may also be used as an alternative.

The control input of a transistor T2 is connected to the capacitor C1 so that, when the transistor T2 is switched on, the supply voltage VCC is reduced to a lower potential via a further transistor T3. The two transistors T2 and T3 are in this case connected as a thyristor stage, so that the switching-on process is carried out quickly and effectively. When the switched-mode power supply is operating normally, the transistor T2 is always switched off, since sufficient voltage to switch the transistor T2 on does not build up across the capacitor C1, as explained above. A capacitor C2 and a resistor R3, connected in parallel with it, are connected to the control input of the transistor T3, so that any disturbance voltage which may occur cannot cause the transistor T3 to switch on, thus switching off the switched-mode power supply.

Closed-loop-controlled switching operation is disturbed in the event of a short circuit on the output side, or else in the event of some other fault, such as an interruption in the control loop. In the event of a short circuit, for example, the control circuit 7 thus tries to switch the switching transistor T1 on for as long as possible, in order in this way to raise the output voltage. This allows the switching transistor T1 to be overloaded.

A further dangerous fault situation is a failure of the control stage 7 in such a manner that it and thus the input G of the switching transistor T1, have a high impedance. In this case, the control voltage Ug rises continuously, due to the starting current Im. However, in consequence, the voltage across the capacitor C1 rises until a specific threshold voltage is reached, at which the transistor T2 switches on. This results in the supply voltage VCC being reduced or dissipated via the transistor T3, as a result of which the control voltage Ug across the resistor Rg falls until the switching transistor T1 switches off again.

The output of the transistor T3 in this exemplary embodiment is, however, not connected directly to earth, but via a resistor R2 to the output of the switching transistor T1, which is connected via the resistor Rs to earth M. When the transistor T3 switches on, then the voltage across R2 raises the voltage across C1, so that the transistor T2 is actuated for a longer period, and the supply voltage VCC is substantially reduced. A diode D2, in parallel with the capacitor C1, in this case prevents the polarity of C1 from being reversed. At the same time, the capacitor C1 is completely discharged via the transistor T2 and a diode D3.

In consequence, the protection circuit carries out a reset operation, so to speak, so that the switching transistor T1 can resume operation after a certain time. However, if the fault situation is still present, then the protection circuit responds once again.

All defects in which the output of the control circuit 7 still has a high impedance, so that a DC voltage builds up at the control input G, are problematic. This is also true if the oscillation of the switched-mode power supply breaks down and the supply voltage VCC is no longer provided via the secondary winding W3, since the starting circuit continues to remain active via the resistor Rm. Since the protection circuit responds cyclically, the switched-mode power supply can resume operation at any time, once the fault has been rectified. By raising the voltage across the capacitor C1 by means of the resistor R2, C1 is in this case always completely discharged in the event of a fault.

In the exemplary embodiment illustrated in the FIGURE, the component values are as follows:

| | |
|---|---|
| R1 = 100 k | C1 = 10 μF |
| R2 = 470 R | C2 = 10 μF |
| R3 = 10 k | |
| Rm = 560 k | |
| Rg = 100 R | |
| Rs = 4 R7 | |

The voltage at which the switching transistor T1 switches on is 5 V. VCC is equal to 14 V.

The threshold voltage is approximately 1.2 volts, and is governed by the base-emitter voltage of T2 and the voltage at which the diode D3 becomes forward-biased. In normal operation, the diode D1 becomes forward-biased at a voltage of about 0.6 volts. If the supply voltage VCC falls to about 1.8 volts, then T2 and T3 are switched off again.

The switched-mode power supply in the FIGURE is in the form of a free-running switched-mode power supply. However, the protection circuit may equally well be used for other switched-mode power supplies, for example for synchronized switched-mode power supplies. It can be used not only for switched-mode power supplies with mains isolation, but also for those without mains isolation, for example DC/DC converters.

What is claimed is:

1. Protection circuit for a switch, which is periodically switched by a control voltage, the protection circuit comprising:

an energy-storage means being coupled via a parallel circuit with a resistance means and a switching means to a control input of said switch, said energy-storage means being charged via said resistance means by an on-level of said control voltage and being discharged via said switching means by an off-level of said control voltage, and a switching stage being coupled to a supply voltage, which switches on at a specific threshold voltage across said energy-storage means, and in consequence reduces said supply voltage, when said switching stage switches on, said energy-storage means is discharged via said switching stage.

2. Protection circuit according to claim 1, characterized in that the charge, which is dissipated from said supply voltage, when said switching stage is switched on, is at least partially routed to said energy-storage means, so that the phase during which said switching stage is switched on is lengthened.

3. Protection circuit according to claim 2, characterized in that said dissipated charge is routed to said energy-storage means via a diode, which is connected in parallel with said energy-storage means.

4. Protection circuit according to claim 1, characterized in that said switching stage comprises two transistors, which are coupled in the form of a thyristor stage, the output of the first one being coupled to a reference potential and the output of the second one being coupled to said energy storage means.

5. Protection circuit according to claim 1, characterized in that said energy-storage means comprises a capacitor, which is charged with a delay via a resistor as the resistance means and is discharged quickly via a diode as the switching means by said control voltage.

6. Protection circuit according to claim 4, characterized in that said energy-storage means and said first transistor are connected to a low potential via a resistor.

7. Switched-mode power supply comprising:

a transformer having a primary winding and at least one secondary winding, a switch being coupled in series with said primary winding, which is periodically switched by a control voltage, a supply stage being connected to a secondary winding and providing a supply voltage for the operation of the switch, a protection circuit for said switch, the protection circuit comprising an energy-storage means being coupled to a control input of said switch and being charged with a delay via resistance means by an on-level of said control voltage and being discharged via switching means by an off-level of said control voltage, and a switching stage being coupled to said supply voltage and to said energy-storage means, which switches on at a specific threshold voltage across the energy-storage means, and in consequence reduces said supply voltage.

8. Switched-mode power supply according to claim 7, characterized in that the power supply comprises further a starting circuit being coupled to said supply circuit, and a second resistance means which is connected between the control input of said switch and said supply circuit, and that the protection circuit comprises further a parallel circuit of a resistor as said resistance means and a diode as said switching means, via which said energy-storage means is connected to the control input of said switch.

9. Switched-mode power supply according to claim 7, characterized in that a resistor is connected between the output of said switch and earth and in that the lower potential of said protection circuit is connected to the output of said switch.

10. Switched-mode power supply according to claim 7, characterized in that power supply is a free-running switched-mode power supply and said switch is a MOSFET.

11. Switched-mode power supply comprising a transformer having a primary winding and at least one secondary winding, a switch being coupled in series with said primary winding, which is periodically switched by a control voltage, a supply stage being connected to a secondary winding and providing a supply voltage for the operation of the switch, a starting circuit being coupled to said supply stage, and a protection circuit for said switch, the protection circuit comprising switch, which is charged via a resistance means by an on-level of said control voltage and being discharged via switching means by an off-level of said control voltage, and a switching stage being coupled to said energy-storage means, for responding to a threshold voltage above said energy-storage means, said threshold voltage being lower than the switching-on voltage of said switch, said switching stage being further coupled to said supply stage for switching on in case of a control voltage having a dc-component which charges said energy storage means up to said threshold in case of a fault, and in consequence reducing said supply voltage.

12. Switched-mode power supply according to claim 11, characterized in that the power supply is a free-running switched-mode power supply and said switch is a MOSFET.

* * * * *